(12) United States Patent
Nassie

(10) Patent No.: US 8,996,788 B2
(45) Date of Patent: Mar. 31, 2015

(54) CONFIGURABLE FLASH INTERFACE

(75) Inventor: Amir Nassie, Haifa (IL)

(73) Assignee: Densbits Technologies Ltd., Haifa (IL)

( * ) Notice: Subject to any disclaimer, the term of this patent is extended or adjusted under 35 U.S.C. 154(b) by 378 days.

(21) Appl. No.: 13/370,114

(22) Filed: Feb. 9, 2012

(65) Prior Publication Data

US 2013/0212316 A1   Aug. 15, 2013

(51) Int. Cl.
*G06F 12/02* (2006.01)
*G06F 13/16* (2006.01)
*G11C 16/00* (2006.01)
*G11C 16/10* (2006.01)

(52) U.S. Cl.
CPC .......... *G06F 12/0246* (2013.01); *G06F 13/16* (2013.01); *G11C 16/00* (2013.01); *G11C 16/10* (2013.01)
USPC ........................................................ 711/103

(58) Field of Classification Search
CPC .............. G06F 3/0679; G06F 12/0246; G06F 2212/2022
USPC ........................................................ 711/103
See application file for complete search history.

(56) References Cited

U.S. PATENT DOCUMENTS

| 4,430,701 A | 2/1984 | Christian et al. |
| 4,463,375 A | 7/1984 | Macovski |
| 4,584,686 A | 4/1986 | Fritze |
| 4,589,084 A | 5/1986 | Fling et al. |
| 4,777,589 A | 10/1988 | Boettner et al. |
| 4,866,716 A | 9/1989 | Weng |
| 5,003,597 A | 3/1991 | Merkle |
| 5,077,737 A | 12/1991 | Leger et al. |
| 5,297,153 A | 3/1994 | Baggen et al. |
| 5,305,276 A * | 4/1994 | Uenoyama ............... 365/230.01 |
| 5,592,641 A | 1/1997 | Doyle et al. |
| 5,623,620 A | 4/1997 | Alexis et al. |
| 5,640,529 A | 6/1997 | Hasbun |
| 5,657,332 A | 8/1997 | Auclair et al. |
| 5,663,901 A * | 9/1997 | Wallace et al. ................ 365/52 |

(Continued)

FOREIGN PATENT DOCUMENTS

WO   WO2009053963 A2   4/2009

OTHER PUBLICATIONS

Search Report of PCT Patent Application WO 2009/118720 A3.

(Continued)

*Primary Examiner* — Reginald Bragdon
*Assistant Examiner* — Mehdi Namazi
(74) *Attorney, Agent, or Firm* — Dentons US LLP

(57) ABSTRACT

A flash memory controller, a non-transitory computer readable medium and a method for performing operations with a flash memory device, the method may include receiving, by a flash memory controller, a request to perform a requested operation with the flash memory device; selecting multiple selected instructions to be executed by a programmable module of the flash memory controller, based upon (a) an interface specification supported by the flash memory device and (b) the requested operation; wherein the programmable module comprising multiple operation phase circuits; and executing the multiple selected instructions by the programmable module, wherein the executing of the multiple selected instructions comprises executing a plurality of selected instructions by multiple operation phase circuits; wherein different operation phase circuits are arranged to execute different operation phases of the requested operation.

27 Claims, 14 Drawing Sheets

(56) References Cited

U.S. PATENT DOCUMENTS

| | | |
|---|---|---|
| 5,724,538 A | 3/1998 | Morris et al. |
| 5,729,490 A | 3/1998 | Calligaro et al. |
| 5,740,395 A | 4/1998 | Wells et al. |
| 5,745,418 A | 4/1998 | Hu et al. |
| 5,778,430 A | 7/1998 | Ish et al. |
| 5,793,774 A | 8/1998 | Usui et al. |
| 5,920,578 A | 7/1999 | Zook et al. |
| 5,926,409 A | 7/1999 | Engh et al. |
| 5,933,368 A | 8/1999 | Hu et al. |
| 5,956,268 A | 9/1999 | Lee |
| 5,956,473 A | 9/1999 | Hu et al. |
| 5,968,198 A | 10/1999 | Balachandran |
| 5,982,659 A | 11/1999 | Irrinki et al. |
| 6,011,741 A * | 1/2000 | Wallace et al. ............... 365/221 |
| 6,016,275 A | 1/2000 | Han |
| 6,038,634 A | 3/2000 | Ji et al. |
| 6,081,878 A | 6/2000 | Estakhri et al. |
| 6,094,465 A | 7/2000 | Stein et al. |
| 6,119,245 A | 9/2000 | Hiratsuka |
| 6,182,261 B1 | 1/2001 | Haller et al. |
| 6,192,497 B1 | 2/2001 | Yang et al. |
| 6,195,287 B1 | 2/2001 | Hirano |
| 6,199,188 B1 | 3/2001 | Shen et al. |
| 6,209,114 B1 | 3/2001 | Wolf et al. |
| 6,259,627 B1 | 7/2001 | Wong |
| 6,272,052 B1 | 8/2001 | Miyauchi |
| 6,278,633 B1 | 8/2001 | Wong et al. |
| 6,279,133 B1 | 8/2001 | Vafai et al. |
| 6,301,151 B1 | 10/2001 | Engh et al. |
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,675,281 B1 | 1/2004 | Oh et al. |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,968,421 B2 | 11/2005 | Conley |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,188,228 B1 | 3/2007 | Chang et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,212,426 B2 | 5/2007 | Park et al. |
| 7,290,203 B2 | 10/2007 | Emma et al. |
| 7,292,365 B2 | 11/2007 | Knox |
| 7,301,928 B2 | 11/2007 | Nakabayashi et al. |
| 7,315,916 B2 | 1/2008 | Bennett et al. |
| 7,388,781 B2 | 6/2008 | Litsyn et al. |
| 7,395,404 B2 | 7/2008 | Gorobets et al. |
| 7,441,067 B2 | 10/2008 | Gorobets et al. |
| 7,443,729 B2 | 10/2008 | Li et al. |
| 7,450,425 B2 | 11/2008 | Aritome |
| 7,454,670 B2 | 11/2008 | Kim et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,610,433 B2 | 10/2009 | Randell et al. |
| 7,613,043 B2 | 11/2009 | Cornwell et al. |
| 7,619,922 B2 | 11/2009 | Li et al. |
| 7,697,326 B2 | 4/2010 | Sommer et al. |
| 7,706,182 B2 | 4/2010 | Shalvi et al. |
| 7,716,538 B2 | 5/2010 | Gonzalez et al. |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,911,848 B2 | 3/2011 | Eun et al. |
| 7,961,797 B1 | 6/2011 | Yang et al. |
| 7,975,192 B2 | 7/2011 | Sommer et al. |
| 8,020,073 B2 | 9/2011 | Emma et al. |
| 8,108,590 B2 | 1/2012 | Chow et al. |
| 8,122,328 B2 | 2/2012 | Liu et al. |
| 8,159,881 B2 | 4/2012 | Yang |
| 8,190,961 B1 | 5/2012 | Yang et al. |
| 8,250,324 B2 | 8/2012 | Haas et al. |
| 8,300,823 B2 | 10/2012 | Bojinov et al. |
| 8,305,812 B2 | 11/2012 | Levy et al. |
| 8,327,246 B2 | 12/2012 | Weingarten et al. |
| 8,407,560 B2 | 3/2013 | Ordentlich et al. |
| 8,417,893 B2 | 4/2013 | Khmelnitsky et al. |
| 2001/0031136 A1* | 10/2001 | Kawamura et al. ............. 386/98 |
| 2001/0034815 A1 | 10/2001 | Dugan et al. |
| 2002/0063774 A1 | 5/2002 | Hillis et al. |
| 2002/0085419 A1 | 7/2002 | Kwon et al. |
| 2002/0154769 A1 | 10/2002 | Petersen et al. |
| 2002/0156988 A1 | 10/2002 | Toyama et al. |
| 2002/0174156 A1 | 11/2002 | Birru et al. |
| 2003/0014582 A1 | 1/2003 | Nakanishi |
| 2003/0065876 A1 | 4/2003 | Lasser |
| 2003/0101404 A1 | 5/2003 | Zhao et al. |
| 2003/0105620 A1 | 6/2003 | Bowen |
| 2003/0177300 A1 | 9/2003 | Lee et al. |
| 2003/0192007 A1 | 10/2003 | Miller et al. |
| 2004/0015771 A1 | 1/2004 | Lasser et al. |
| 2004/0030971 A1 | 2/2004 | Tanaka et al. |
| 2004/0059768 A1 | 3/2004 | Denk et al. |
| 2004/0080985 A1 | 4/2004 | Chang et al. |
| 2004/0153722 A1 | 8/2004 | Lee |
| 2004/0153817 A1 | 8/2004 | Norman et al. |
| 2004/0181735 A1 | 9/2004 | Xin |
| 2004/0203591 A1 | 10/2004 | Lee |
| 2004/0210706 A1 | 10/2004 | In et al. |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le-Bars et al. |
| 2005/0144213 A1 | 6/2005 | Simkins et al. |
| 2005/0144368 A1 | 6/2005 | Chung et al. |
| 2005/0169057 A1 | 8/2005 | Shibata et al. |
| 2005/0172179 A1 | 8/2005 | Brandenberger et al. |
| 2005/0213393 A1 | 9/2005 | Lasser |
| 2005/0243626 A1 | 11/2005 | Ronen |
| 2006/0059406 A1 | 3/2006 | Micheloni et al. |
| 2006/0059409 A1 | 3/2006 | Lee |
| 2006/0064537 A1 | 3/2006 | Oshima |
| 2006/0101193 A1 | 5/2006 | Murin |
| 2006/0195651 A1 | 8/2006 | Estakhri et al. |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0282411 A1 | 12/2006 | Fagin et al. |
| 2006/0284244 A1 | 12/2006 | Forbes et al. |
| 2006/0294312 A1 | 12/2006 | Walmsley |
| 2007/0025157 A1 | 2/2007 | Wan et al. |
| 2007/0063180 A1 | 3/2007 | Asano et al. |

(56) References Cited

U.S. PATENT DOCUMENTS

| | | |
|---|---|---|
| 2007/0081388 A1 | 4/2007 | Joo |
| 2007/0098069 A1 | 5/2007 | Gordon |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0140006 A1 | 6/2007 | Chen et al. |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata et al. |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2007/0297226 A1 | 12/2007 | Mokhlesi |
| 2008/0010581 A1 | 1/2008 | Alrod et al. |
| 2008/0028014 A1 | 1/2008 | Hilt et al. |
| 2008/0049497 A1 | 2/2008 | Mo |
| 2008/0055989 A1 | 3/2008 | Lee et al. |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0112238 A1 | 5/2008 | Kim et al. |
| 2008/0116509 A1 | 5/2008 | Harari et al. |
| 2008/0126686 A1 | 5/2008 | Sokolov et al. |
| 2008/0127104 A1 | 5/2008 | Li et al. |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0137414 A1 | 6/2008 | Park et al. |
| 2008/0141043 A1 | 6/2008 | Flynn et al. |
| 2008/0148115 A1 | 6/2008 | Sokolov et al. |
| 2008/0158958 A1 | 7/2008 | Shalvi et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0201620 A1 | 8/2008 | Gollub |
| 2008/0209114 A1 | 8/2008 | Chow et al. |
| 2008/0219050 A1 | 9/2008 | Shalvi et al. |
| 2008/0225599 A1 | 9/2008 | Chae |
| 2008/0250195 A1 | 10/2008 | Chow et al. |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0027961 A1 | 1/2009 | Park et al. |
| 2009/0043951 A1 | 2/2009 | Shalvi et al. |
| 2009/0046507 A1 | 2/2009 | Aritome |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn |
| 2009/0132755 A1 | 5/2009 | Radke |
| 2009/0144598 A1 | 6/2009 | Yoon et al. |
| 2009/0144600 A1 | 6/2009 | Perlmutter et al. |
| 2009/0150599 A1 | 6/2009 | Bennett |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2009/0282185 A1 | 11/2009 | Van Cauwenbergh |
| 2009/0282186 A1 | 11/2009 | Mokhlesi et al. |
| 2009/0287930 A1 | 11/2009 | Nagaraja |
| 2009/0300269 A1 | 12/2009 | Radke et al. |
| 2009/0323942 A1 | 12/2009 | Sharon et al. |
| 2010/0005270 A1 | 1/2010 | Jiang |
| 2010/0025811 A1 | 2/2010 | Bronner et al. |
| 2010/0030944 A1 | 2/2010 | Hinz |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0172179 A1 | 7/2010 | Gorobets et al. |
| 2010/0174853 A1 | 7/2010 | Lee et al. |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0241793 A1 | 9/2010 | Sugimoto et al. |
| 2010/0246265 A1 | 9/2010 | Moschiano et al. |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0269008 A1 | 10/2010 | Leggette et al. |
| 2010/0293321 A1 | 11/2010 | Weingarten |
| 2010/0318724 A1 | 12/2010 | Yeh |
| 2011/0051521 A1 | 3/2011 | Levy et al. |
| 2011/0055461 A1 | 3/2011 | Steiner et al. |
| 2011/0093650 A1 | 4/2011 | Kwon et al. |
| 2011/0096612 A1 | 4/2011 | Steiner et al. |
| 2011/0099460 A1 | 4/2011 | Dusija et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0194353 A1 | 8/2011 | Hwang et al. |
| 2011/0209028 A1 | 8/2011 | Post et al. |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0017136 A1 | 1/2012 | Ordentlich et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |
| 2012/0110250 A1 | 5/2012 | Sabbag et al. |

(56) References Cited

U.S. PATENT DOCUMENTS

| | | |
|---|---|---|
| 2012/0124273 A1 | 5/2012 | Goss et al. |
| 2012/0246391 A1 | 9/2012 | Meir et al. |

OTHER PUBLICATIONS

Search Report of PCT Patent Application WO 2009/095902 A3.
Search Report of PCT Patent Application WO 2009/078006 A3.
Search Report of PCT Patent Application WO 2009/074979 A3.
Search Report of PCT Patent Application WO 2009/074978 A3.
Search Report of PCT Patent Application WO 2009/072105 A3.
Search Report of PCT Patent Application WO 2009/072104 A3.
Search Report of PCT Patent Application WO 2009/072103 A3.
Search Report of PCT Patent Application WO 2009/072102 A3.
Search Report of PCT Patent Application WO 2009/072101 A3.
Search Report of PCT Patent Application WO 2009/072100 A3.
Search Report of PCT Patent Application WO 2009/053963 A3.
Search Report of PCT Patent Application WO 2009/053962 A3.
Search Report of PCT Patent Application WO 2009/053961 A3.
Search Report of PCT Patent Application WO 2009/037697 A3.
Yani Chen, Keshab K. Parhi, "Small Area Parallel Chien Search Architectures for Long BCH Codes", Ieee Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-72 vol. 2.
Michael Purser, "Introduction to Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips. com).
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions on Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built in Self Diagnosis", ITC International Test Conference, Paper 2.1.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com.
Paulo Cappelletti, Clara Golla, Piero Olivo, Enrico Zanoni, "Flash Memories", Kluwer Academic Publishers, 1999.
JEDEC Standard, "Stress-Test-Driven Qualification of Integrated Circuits", JEDEC Solid State Technology Association. JEDEC Standard No. 47F pp. 1-26.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.

* cited by examiner

CONFIGURABLE FLASH INTERFACE

FIELD OF THE INVENTION

The present invention relates to flash memory devices and, in particular, to methods and systems for selecting and executing multiple instructions in a flash memory device in support of a requested operation, where the execution of the instructions is performed by multiple operation phase circuits arranged to execute different operation phases of the requested operation.

BACKGROUND

Flash memory device can be coupled to other devices such as a flash memory controller over an interface. A single flash memory controller can be connected via the interface to multiple flash memory devices.

The interface can include multiple wires that are used to convey control and data between one or more flash memory devices and a flash memory controller.

Each flash memory device can support a single interface specification. The interface specification defines the physical configuration of the interface as well as an interface protocol that is supported by the flash memory device.

The interface protocol can define the commands that should be exchanged with the flash memory device, as well as the order and the timing of various control and data signals.

Referring to FIG. 1, an interface is illustrated as being connected between a flash memory controller 40 and two flash memory devices 20 and 30—all belonging to system 10. The interface includes a data bus for conveying addresses, commands or data signals (D[0:7] 17), and control signals such as address latch enable (ALE) 16, write enable (WEn) 13, read enable (REn) 14 and command latch enable (CLE) 15. These control signals are shared between the different flash memory devices.

A chip select signal (such as CE_0 11 and CE_1 18) is provided for each flash memory device. A ready/busy (RB) signal (such as RB_0 12 and RB_1 19) is provided for each flash memory device.

The flash memory controller can be equipped with various circuits that are arranged to execute different operations such as a read operation, a write operation, a program operation and an erase operation. Each of these circuits is responsible to complete the entire operation and each circuit is tailored to a single interface specification. Referring to FIG. 1, the flash memory controller 40 may include a read circuit 42, an erase circuit 44 and a programming circuit 46 that are tailored to a first interface specification that is supported by first and second flash memory devices 20 and 30. The read circuit 42 executes read operations, the programming circuit 46 executes write operations and the erase circuit 44 executes erase operations.

Different flash memory devices can support different interface specifications. Interface specifications can differ from each other by one or more parameters such as the type of commands, the timing of commands and the sequence of commands that are required for supporting an operation.

There are at least two interface specifications known as "ONFi" and "Toggle NAND" and there are also many other interface specifications that differ from those two interface specifications, some of which are unpublished.

There is a need to provide a flash memory controller that is capable of interfacing with flash memory devices that support different interface specifications.

SUMMARY OF THE INVENTION

In an embodiment of the present invention, a method may be provided and may include receiving, by a flash memory controller, a request to perform a requested operation with the flash memory device; selecting multiple selected instructions to be executed by a programmable module of the flash memory controller, based upon (a) an interface specification supported by the flash memory device and (b) the requested operation; wherein the programmable module may include multiple operation phase circuits; and executing the multiple selected instructions by the programmable module, wherein the executing of the multiple selected instructions may include executing a plurality of selected instructions by multiple operation phase circuits; wherein different operation phase circuits are arranged to execute different operation phases of the requested operation.

The multiple operation phase circuits may include a command phase circuit, an address phase circuit and a program phase circuit.

The method may include storing at the programmable module commands associated with different specifications of interfaces.

The method may include storing at the programmable module commands associated only with the interface specification supported by the flash memory device.

The selected instructions may be selected from a group of instructions that may include a command instruction, an address instruction, a data read instruction, a data program instruction and at least one management instruction indicative of at least one of (a) a timing of an execution of another command, and (b) an order of execution of the plurality of commands.

The at least one management instruction may be a jump instruction.

The group of instructions may include a release instruction for stopping a control of the flash memory device on the flash memory device.

The group of instructions may include an interrupt instruction for interrupting a processor that may be connected to the flash memory device and to the flash memory controller.

The programmable module may include a programmable signal generator and the method may include determining whether to execute the requested operation by the programmable signal generator or by the plurality of operation phase circuits; wherein if it is determined to execute the requested operation by the programmable signal generator then executing the requested operation by the programmable signal generator; wherein if it is determined to execute the requested operation by the plurality of operation phase circuits then executing the requested operation by the plurality of operation phase circuits.

The determining may be responsive to a capability of the plurality of operation phase circuits to generate a combination of waveforms mandated by the requested operation.

The flash memory device may be a first flash memory device and supports a first interface specification; wherein the flash memory controller may be connected to another flash memory device that supports another interface specification, wherein the other interface specification differs from the first interface specification. The method may include receiving another request to perform another requested operation with the other flash memory device; selecting multiple selected instructions to be executed by the programmable module, based upon (a) the other interface specification and (b) the other requested operation; and executing the multiple selected instructions by the programmable module.

The method may include powering up the flash memory controller; retrieving firmware from the flash memory device; executing the firmware by an internal controller of the flash memory controller; wherein the executing of the firmware may include determining the type of the flash memory device and retrieving at least a portion of a group of instructions, wherein the group of instructions may include the selected instructions.

Further embodiments of the invention include a computer readable medium that is non-transitory and may store instructions for performing the above-described methods and any steps thereof, including any combinations of same. For example, the computer readable medium may store instructions for execution by one or more processors or similar devices, which instructions, when executed, result in, cause or facilitate receiving a request to perform a requested operation with a flash memory device; selecting multiple selected instructions to be executed by a programmable module of the flash memory controller, based upon (a) an interface specification supported by the flash memory device and (b) the requested operation; wherein the programmable module may include multiple operation phase circuits; and executing the multiple selected instructions by the programmable module, wherein the executing of the multiple selected instructions may include executing a plurality of selected instructions by multiple operation phase circuits. Different operation phase circuits are arranged to execute different operation phases of the requested operation.

The multiple operation phase circuits may include a command phase circuit, an address phase circuit and a program phase circuit.

The non-transitory computer readable medium may store instructions for storing at the programmable module commands associated with different specifications of interfaces.

The non-transitory computer readable medium may store instructions for storing at the programmable module commands associated only with the interface specification supported by the flash memory device.

The selected instructions may be are selected from a group of instructions that may include a command instruction, an address instruction, a data read instruction, a data program instruction and at least one management instruction indicative of at least one of (a) a timing of an execution of another command, and (b) an order of execution of the plurality of commands.

The at least one management instruction may be a jump instruction.

The group of instructions may further include a release instruction for stopping a control of the flash memory device on the flash memory device.

The group of instructions may further include an interrupt instruction for interrupting a processor that may be connected to the flash memory device and to the flash memory controller.

The programmable module may include a programmable signal generator. The non-transitory computer readable medium may store instructions for determining whether to execute the requested operation by the programmable signal generator or by the plurality of operation phase circuits. Wherein if it is determined to execute the requested operation by the programmable signal generator then executing the requested operation by the programmable signal generator. Wherein if it is determined to execute the requested operation by the plurality of operation phase circuits then executing the requested operation by the plurality of operation phase circuits.

The non-transitory computer readable medium may store instructions for determining in response to a capability of the plurality of operation phase circuits to generate a combination of waveforms mandated by the requested operation.

The flash memory device may be a first flash memory device and support a first interface specification; wherein the flash memory controller may be connected to another flash memory device that supports another interface specification, wherein the other interface specification differs from the first interface specification. The non-transitory computer readable medium may store instructions for receiving another request to perform another requested operation with the other flash memory device; selecting multiple selected instructions to be executed by the programmable module, based upon (a) the other interface specification and (b) the other requested operation; and executing the multiple selected instructions by the programmable module.

The non-transitory computer readable medium may store instructions for powering up the flash memory controller; retrieving firmware from the flash memory device; executing the firmware by an internal controller of the flash memory controller; wherein the executing of the firmware may include determining the type of the flash memory device and retrieving at least a portion of a group of instructions, wherein the group of instructions may include the selected instructions.

Additional embodiments of the invention include a flash memory controller that may include an input port arranged to receive a request to perform a requested operation with a flash memory device; a programmable module arranged to execute multiple selected instructions, wherein the multiple selected instructions are selected by the flash memory controller based upon based upon (a) an interface specification supported by the flash memory device and (b) the requested operation; wherein the programmable module may include multiple operation phase circuits that are arranged to execute a plurality of the selected instructions; wherein different operation phase circuits are arranged to execute different operation phases of the requested operation.

The multiple operation phase circuits may include a command phase circuit, an address phase circuit and a program phase circuit.

The flash memory controller may be arranged to store at the programmable module commands associated with different specifications of interfaces.

The flash memory controller may be arranged to store at the programmable module commands associated only with the interface specification supported by the flash memory device.

The selected instructions may be selected from a group of instructions that may include a command instruction, an address instruction, a data read instruction, a data program instruction and at least one management instruction indicative of at least one of (a) a timing of an execution of another command, and (b) an order of execution of the plurality of commands.

The at least one management instruction may be a jump instruction.

The group of instructions may further include a release instruction for stopping a control of the flash memory device on the flash memory device.

The group of instructions may further include an interrupt instruction for interrupting a processor that may be connected to the flash memory device and to the flash memory controller.

The programmable module may include a programmable signal generator. The flash memory controller may be arranged to determine whether to execute the requested operation by the programmable signal generator or by the plurality of operation phase circuits. Wherein if it is determined to execute the requested operation by the programmable signal generator then execute the requested operation by the programmable signal generator. Wherein if it is determined to execute the requested operation by the plurality of operation phase circuits then execute the requested operation by the plurality of operation phase circuits.

The flash memory controller may be arranged to determine in response to a capability of the plurality of operation phase circuits to generate a combination of waveforms mandated by the requested operation.

The flash memory device may be a first flash memory device and supports a first interface specification. The flash memory controller may be connected to another flash memory device that supports another interface specification. The other interface specification differs from the first interface specification. The flash memory controller may be arranged to receive another request to perform another requested operation with the other flash memory device; select multiple selected instructions to be executed by the programmable module, based upon (a) the other interface specification and (b) the other requested operation and execute the multiple selected instructions by the programmable module.

The flash memory controller may be arranged to power up the flash memory controller; retrieve firmware from the flash memory device and execute the firmware by an internal controller of the flash memory controller. The execution of the firmware may include determining the type of the flash memory device and retrieving at least a portion of a group of instructions. The group of instructions may include the selected instructions.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
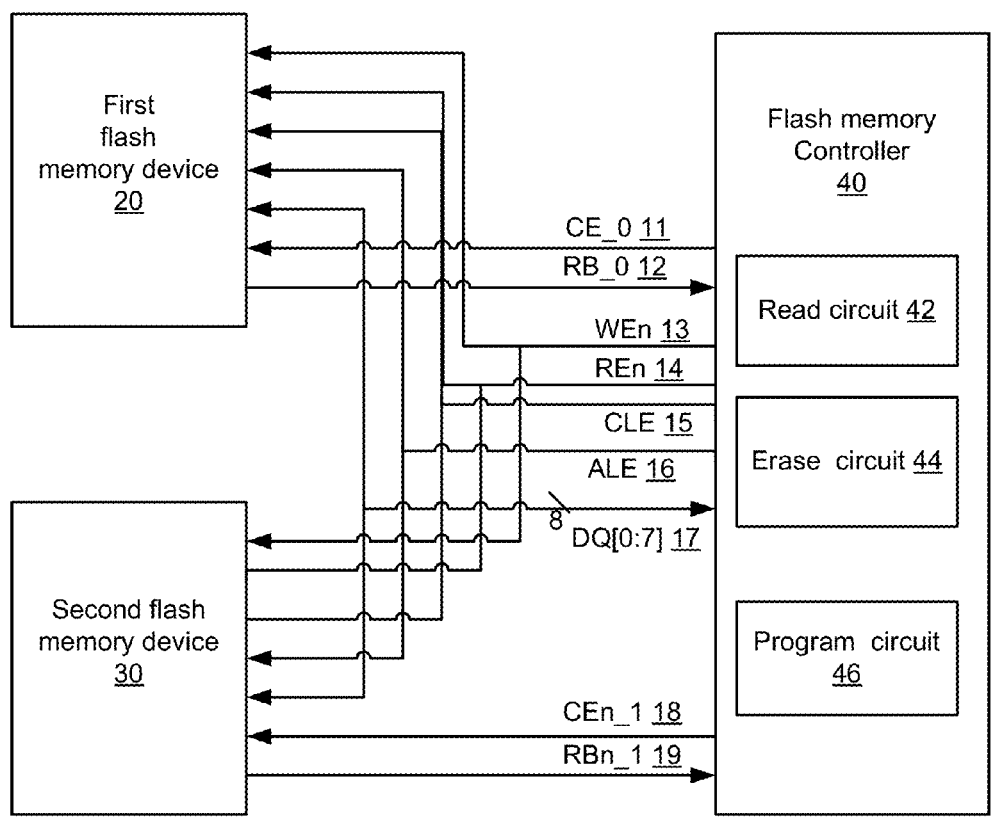
FIG. 1 illustrates a prior art flash memory controller and its environment.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

There is provided a flash memory controller that can support multiple interface specifications by executing different combinations of such phases. The flash memory controller can include multiple operation phase circuits such as a command phase circuit, an address phase circuit and a program phase circuit.

The flash memory controller can support different interface specification as well as updates to existing interface specifications. The flash memory controller can support unpublished vendor interface specifications—based upon information that may be provided from the vendor.

The multiple operation phase circuits can execute instructions stored in a programmable module. The instructions can be designed to fit the different interface specifications. A group of instructions can be provided for each interface specification. Changes in interface specifications and addition of interface specifications can be addresses by providing compatible instructions to the flash memory device.

The instructions can be microinstructions that are machine level instructions. The instruction can be higher level instructions and thus differ from microinstructions.

According to an embodiment of the invention each operation is partitioned to phases that may be executed by dedicated operation phase circuits.

A phase can include one or more cycles of an operation and one or more waiting periods. A phase can include one or more combinations of values of control and/or data signals and/or of one or more transitions of one or more control and/or data signals. Different phases can differ from each other by type— by the signals that are involves in each phase. For example, different phases can include a command phase, an address phase and a program phase.

Figure 2:
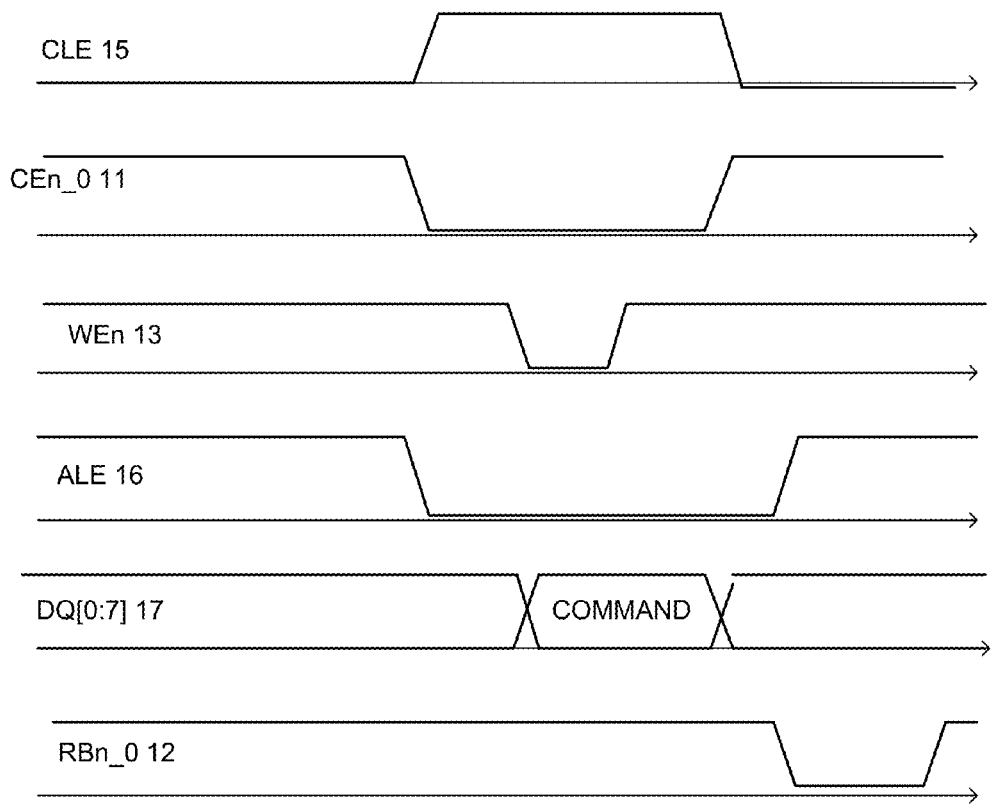
FIGS. 2 and 3 illustrate a command phase and a read unique ID operation.

FIG. 2 illustrates a command phase that includes raising signal WEn 13 while signal CLE 15 is high, CEn_0 11 is low and an appearance of a command "COMMAND" on data lines DQ[0:7] for a short period of time.

A read operation can, for example, include a command phase, followed by an address phase that may be followed by a data out phase. Each phase can include one or more cycles of an operation and one or more waiting periods.

Figure 3:
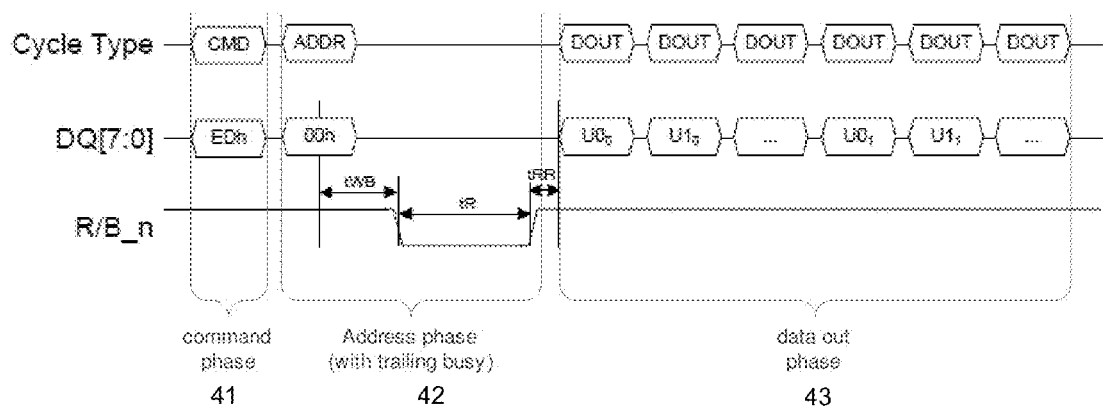

FIG. 3 illustrates a read unique ID operation that includes multiple phases—a command phase 41, an address phase 42 and a data out phase 43.

The command phase 41 includes a command (CMD) cycle, the address phase 42 includes an address (ADDR) cycle that is followed by a waiting period, and the data out phase 43 includes six data out (DOUT) cycles. As will be illustrated below—each phase is executed by a different operation phase circuit of the flash memory controller.

Figure 4A:
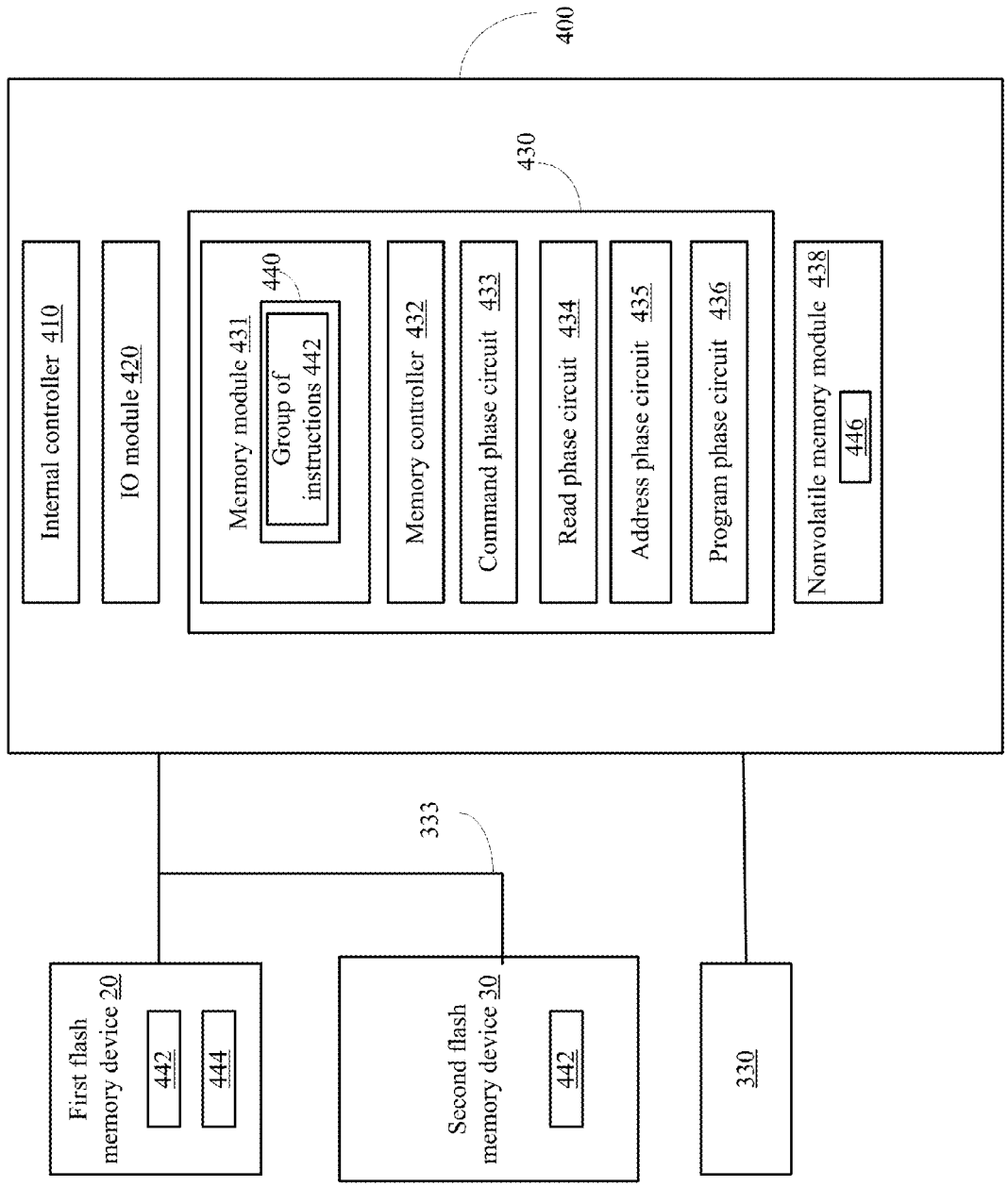
FIGS. 4A-4C illustrate flash memory controllers and their environments according to various embodiments of the invention.

FIG. 4A illustrates a flash memory controller 400 and its environment according to an embodiment of the invention.

The flash memory controller 400 includes an internal controller 410, a programmable module 430 and an input/output (IO) module 420 that interfaces between the flash memory controller 400 and other components.

The IO module 420 is connected to an interface 333 that couples the flash memory controller 400 to one or more flash memory devices such as first flash memory device 20 and second flash memory device 30.

The processor 330 may be coupled to the flash memory controller 400 by links that differ from interface 333.

The requested operation can include a read operation, a program operation, an erase operation and the like.

The internal controller 410 is termed internal as it belongs to the flash memory controller 400. It can be replaced by an external controller (not shown).

The programmable module 430 includes a memory module 431, a memory controller 432 and multiple operation phase circuits 433-436.

The multiple operation phase circuits can include, for example, a command phase circuit 433, a read phase circuit 434, an address phase circuit 435 and a program phase circuit 436.

The command phase circuit 433 can execute the command (CMD) phase of an operation.

The address phase circuit 435 can execute the address phase of the operation.

The program phase circuit 436 can perform the program phase of the operation.

The read phase circuit 434 can execute the read phase of the operation.

These operation phase circuits can execute operations according to different interface specifications. Each interface specification can be associated with a group of instructions (to be executed by the programmable module 430) and each operation can be performed by executing instructions that are selected according to (a) the interface specification supported by the flash memory device that participates in the operation and (b) the requested operation.

The memory module 431 may be arranged to store the group of instructions that includes instructions to be executed by the multiple operation phase circuits 433-436.

The memory module 431 can store only a group of instructions that correspond to the interface specification that is supported by any of the flash memory devices that are coupled to the flash memory controller 400.

For example, the memory module 431 may store one or more groups of instructions that are associated with one or more interface protocols supported by the first and second flash memory devices 20 and 30. FIG. 4A illustrates a group of instructions 442 that is stored at the memory module 431.

According to another embodiment of the invention, the memory module 431 can also store one or more groups of instructions that are associated with one or more interface specifications that are not supported by any flash memory device that is coupled to the flash memory device.

Figure 6:
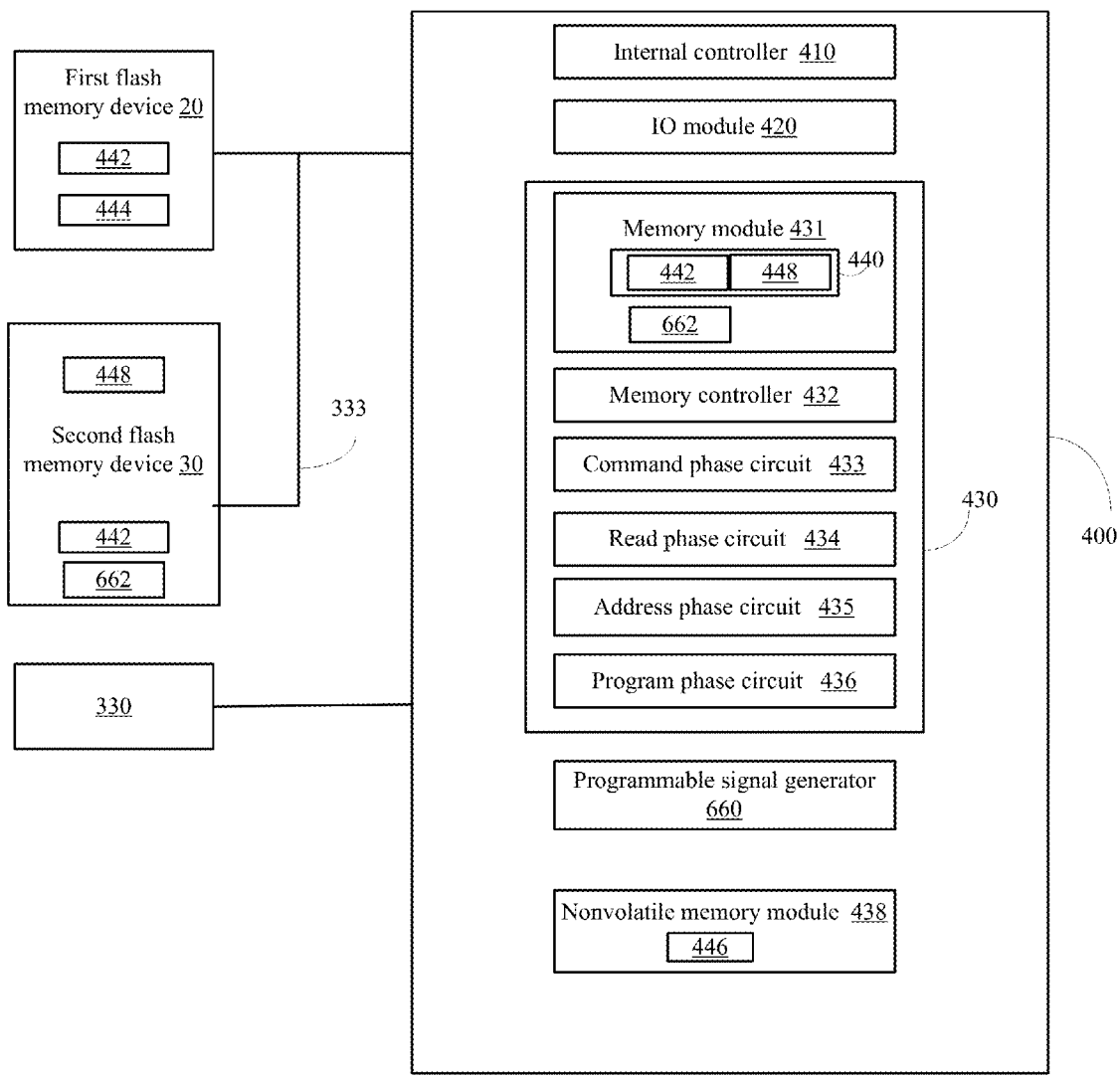
FIG. 6 illustrates a flash memory controller and its environment according to an embodiment of the invention.

The internal controller 410 can determine which groups of instructions should be stored at the memory module 431. The determination can be responsive to the protocol specification supported by the flash memory devices coupled to the flash memory controller. The internal controller 410 can, for example, determine to store more groups of instructions if the memory module 431 has enough space. FIG. 6 illustrate an additional group of instructions 448 as being stored at the memory module 431.

Memory module 431 can be a volatile memory module.

Once a request to perform a requested operation is received by the flash memory controller 400 a selection of so-called selected instructions is made. These selected instructions, once executed, result in a completion of the requested operation.

It is noted that the processor 330 can request to execute a set of operations by sending a single request. The format of such a request may be determined in advance. The set can, for example, represented by a predetermined code. Alternatively, a single request can list the instructions of the set—and thus may reduce the traffic between the processor 330 and the flash memory controller.

Assuming that a request to execute a requested operation is received—the selection of the selected instructions is made according to (a) the interface specification supported by the flash memory device that participates in the operation and (b) the requested operation.

The selection can be made by at least one of the memory controller 432 and the internal controller 410. The selection according to (b) the requested operation is made by the memory controller 432.

The selection according to (a) the interface specification can be made by the memory controller 432 if, for example, there is more than a single group of instructions within the memory module 431. On the other hand if the memory module 431 stores only a single group of instructions then the selection according to the interface specification was already made by the internal controller 410—by determining to store only the group of instructions that matches the interface specification at the memory module 431.

The selected instructions can include (a) one or more selected instruction that are executed by one operation phase circuits and (b) zero or more selected instructions can be executed by one or more other elements of the programmable module—such as the memory controller 432.

The memory controller 432 can execute one or more management instructions. A management instruction can be indicative of at least one of (a) a timing of an execution of another instruction, and (b) an order of execution of the plurality of instructions.

For example, a management instruction can delay the execution of a next instruction for a predetermined period of time, upon an occurrence of an event. For example, a management instruction can delay the retrieval of a selected instruction from the memory module 431 and thus delay the execution of that selected instruction.

Yet according to another example the management instruction can change an order of retrieval of instructions. The latter can be a jump instruction.

It is noted that an instruction can be tagged as a last instruction of a set of instructions that should be executed in order to complete an operation. This tag can assist the memory controller 432 in deciding when to stop the retrieval of selected instructions from the memory module 431.

It is noted that the programmable module 430 can send selected instructions to be executed by components that differ from the programmable module 430.

For example, the programmable module 430 can send to the internal controller 410 instructions to be executed by the internal controller 410.

Two non-limiting examples of such instructions include a release instruction and an interrupt instruction.

The release instruction causes the flash memory controller 400 to give up a control of the flash memory controller 400 on the flash memory device (20 or 30) and releases the interface 333 or the flash memory devices (20 or 30) thus allowing another entity (such as processor 330) to gain control over the interface 333 or one of the flash memory devices.

The interrupt instruction causes the flash memory controller 400 to interrupt a processor (such as processor 330) that is coupled to the flash memory device and to the flash memory controller 400.

The instructions can have any desired format. A non-limiting example of a form a of various instructions is provided below:

Command instruction—may include the opcode of the command to be executed during a command phase.

Address instruction—may include an address size field (number of address cycles that include the address) and an address location field that may include a pointer that points to the location of the address.

Read instruction—may include a size field indicative of the amount of data to be read and may include a destination field that may indicate where to store the read data (at the flash memory controller).

A programmable signal generator instruction that indicates that certain phases (or a portion of a phase) should be executed by a programmable signal generator (denoted 660 in FIG. 6).

An idle instruction command—may indicate a length of an idle period. The length can be provided in cycles.

A jump instruction that may cases the memory controller 432 to retrieve an instruction pointed by the jump instruction.

The instructions can be stored at a stack 440 of the memory module 430.

Each instruction may include an end field or may be stored at the same stack line with an end field. The end field indicates that the instruction is the last instruction that is related to a requested operation.

Each of the mentioned above instructions can be included in another instruction or be stored at the same stack line.

Each instruction may include a "wait for ready" field or be stored at the same stack line with the "wait for ready" field. The "wait for ready" field indicates that a retrieval of a next instruction from the stack is conditioned by a reception of a non busy indication from a flash memory device. Alternatively, the retrieval can be further delayed by one or more idle cycles from the reception of the non busy indication.

It is noted that multiple operations can be concatenated by scanning selected instructions that are related with each of the operations.

Referring back to FIG. 4A—each instruction can be stored at a single line of the stack denoted 440 in FIG. 4A.

According to an embodiment of the invention a line of stack 440 can store more than a single instruction. A line can store a combination of any of the above instructions.

A single line can store one or more instruction to be executed by an operation phase circuit and one or more management instruction. For example, a line can include an instruction that should be executed by an operation phase circuit and a management instruction that may affect the timing of retrieval of the next stack line or next instruction.

The memory module 431 can store additional instructions. It may store that one or more groups of instructions in various manners such as in a stack 440, in a buffer and the like.

Each group of instructions that is stored in the memory module 431 can be also stored in one or more flash memory devices such as flash memory device 20 and, additionally or alternatively, flash memory device 30.

The memory module 431 can be a volatile memory module (such as a random access memory module) and the storage of each group of instructions at a flash memory device (20 and/or 30) can backup that group of instructions.

The group of instructions can be loaded to the memory module 431 during a boot sequence or at a later time—but before it is should be used by the programmable module 430.

The memory controller 432 can read the selected instructions, one after the other, and send them to the operation phase circuits.

The memory controller 432 can include (or be coupled to) a parser that parses each retrieved instructions and determines where to send it.

The flash memory controller 400 can participate in an initialization stage. The initialization stage can be executed when the flash memory controller 400 is powered up.

After being powered-up the internal controller 410 can read firmware (denoted 444 in FIG. 4A) from one of the flash memory devices 20 or 30. This retrieval of firmware 444 can be a part of a boot code executed by the internal controller 410. The boot code 446 can be stored at a flash memory module 438 of the flash memory controller 400. The firmware can be stored at the memory module 431.

The firmware 444 may cause the internal controller 410 to (a) determine the interface specification supported by each flash memory device that is coupled to the flash memory controller and (b) retrieve the appropriate groups of instructions from the one or more flash memory devices.

The initial access to the flash memory device can include using one or more instructions that are supported by multiple interface specification. For example, a read unique identifier instructions is supported by all (or many) interface specifications. The response of the flash memory device to this instruction reveals which interface specification is supported by it.

FIG. 4A illustrates stack 440 as storing a group of instructions 442 that is associated with an interface specification supported by the first and second flash memory devices 20 and 30. Copies of the group of instructions 442 are stored at each one of first and second flash memory devices 20 and 30.

FIG. 4A also illustrates firmware 444 as being stored at the first flash memory device 20. FIG. 4A further illustrates boot code 446 as being stored as a nonvolatile memory module 438 of flash memory controller 400.

Figure 4B:
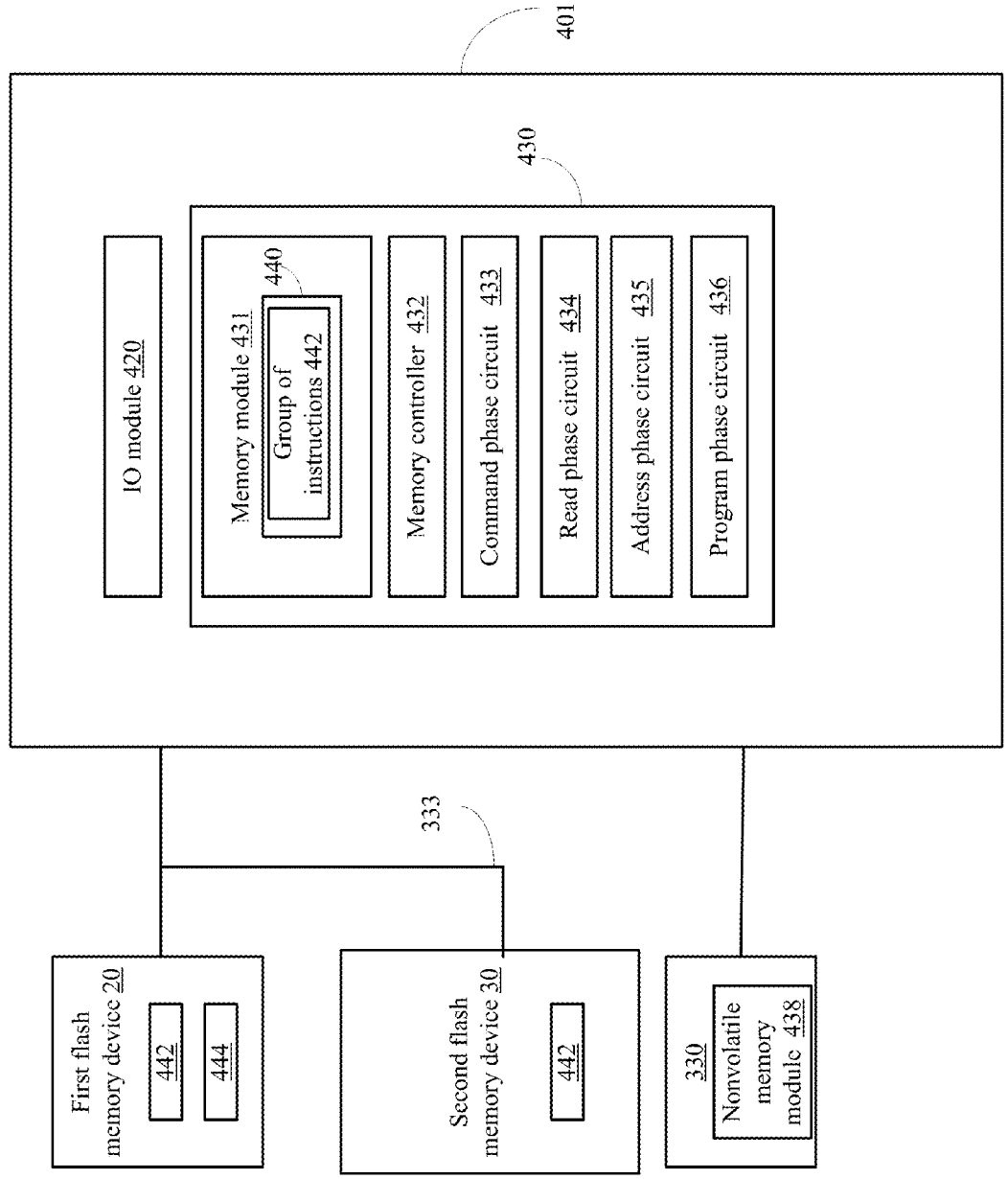

FIG. 4B illustrates a flash memory controller 401 and its environment according to an embodiment of the invention.

Flash memory controller 401 differs from flash memory controller 400 by lacking an internal controller 410 and by having the nonvolatile memory module 438 in the processor 330. In this configuration the processor 330 performs the functions of the internal memory module 410. For example, processor 330 may initialize the flash memory controller 401.

Figure 4C:
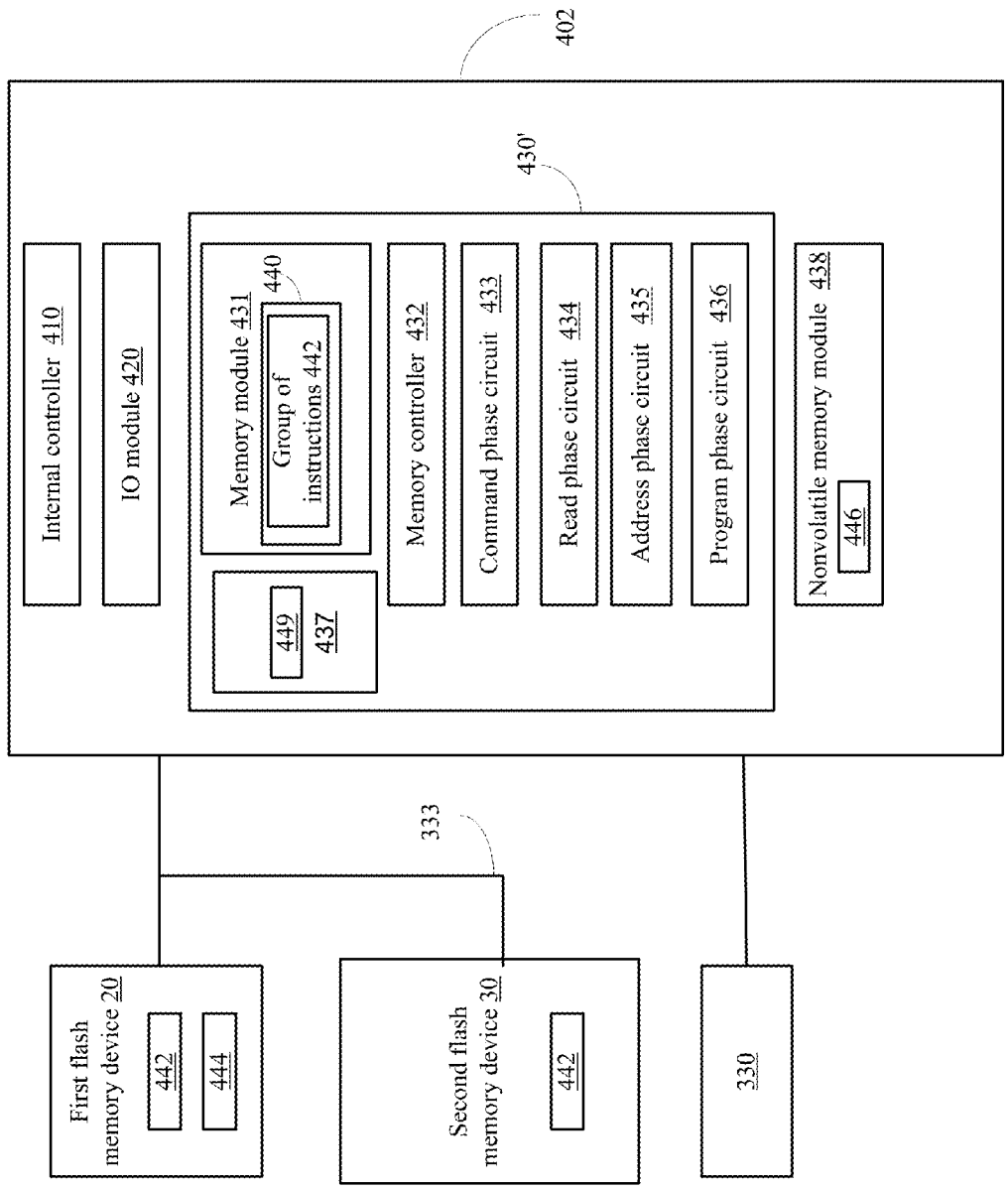

FIG. 4C illustrates a flash memory controller 402 and its environment according to an embodiment of the invention.

Flash memory controller 402 differs from flash memory controller 400 by having a nonvolatile memory module 437 that stores initialization information 449 that allows the programmable module 430' to perform at least the first access to the flash memory device.

Figure 5A:
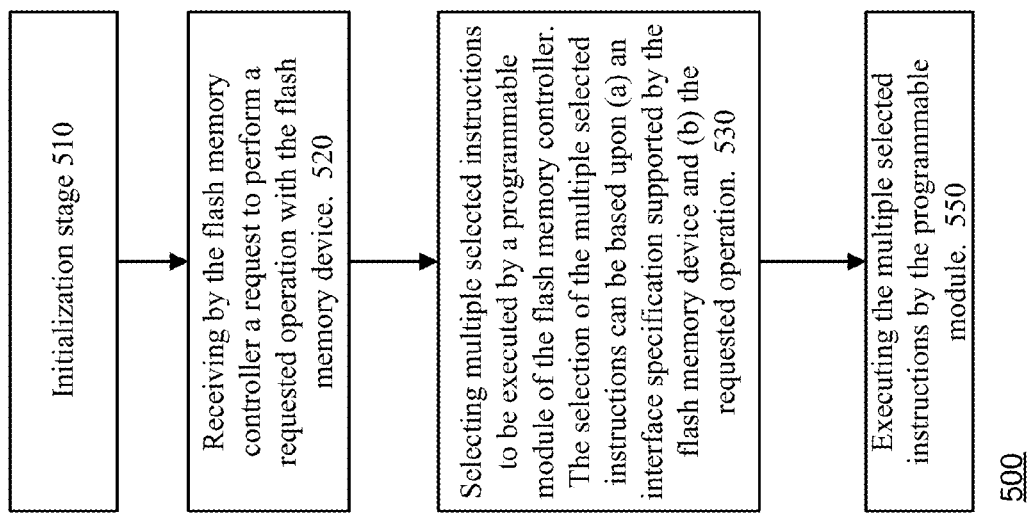
FIGS. 5A-5B illustrate methods according to various embodiments of the invention.

FIG. 5A illustrates method 500 for performing operations with a flash memory device, according to an embodiment of the invention.

Method 500 can be executed by a flash memory controller such as flash memory controller 400 of FIG. 4A.

Method 500 can start by initialization stage 510.

The initialization stage 510 can include powering up the flash memory controller; retrieving firmware from a flash memory device and executing the firmware by an internal controller of the flash memory controller. The execution of the firmware may include determining which interface specification is supported by the flash memory device (what is the type of the flash memory device) and retrieving at least a portion of a group of instructions that corresponds to that interface specification.

After the initialization is completed method 510 can perform multiple iterations of stages 520, 530 and 550.

Stage 520 may include receiving (by the flash memory controller) a request to perform a requested operation with the flash memory device.

Stage 520 may be followed by stage 530 of selecting multiple selected instructions to be executed by a programmable module of the flash memory controller. The selection of the multiple selected instructions can be based upon (a) an interface specification supported by the flash memory device and (b) the requested operation.

Stage 530 may be followed by stage 550 of executing the multiple selected instructions by the programmable module.

One or more of the selected instructions can be executed by one or more operation phase circuit.

Each operation phase circuit can be responsible for executing a phase of an operation.

A single operation can include multiple operation phases and thus an execution of a single operation can be represented by different selected instructions that are executed by different operation phase circuits.

The multiple operation phase circuits can include a command phase circuit, a read phase circuit, an address phase circuit and a program phase circuit. The command phase circuit can execute the command (CMD) phase of a operation. The address phase circuit can execute the address phase of the operation. The program phase circuit can perform the program phase of the operation. The read phase circuit can execute the read phase of the operation.

Zero or more selected instructions can be executed by one or more other elements of the programmable module.

The one or more other elements can execute a management instruction. A management instruction can be indicative of at least one of (a) a timing of an execution of another command, and (b) an order of execution of the plurality of commands.

For example, a management instruction can delay the execution of a next instruction for a predetermined period of time, upon an occurrence of an event, or can instruct to change an order of retrieval of instructions (a jump command).

The group of instructions can include a release instruction for stopping a control of the flash memory device on the flash memory device.

The group of instructions can include an interrupt instruction for interrupting a processor that is coupled to the flash memory device and to the flash memory controller.

The selected instructions can form a microcode that can be stored in a stack or any portion of a memory module of the flash memory model. The microcode can also be stored in one of the flash memory devices that are coupled to the flash memory controller. The latter can backup the microcode when the system is powered down.

Figure 5B:
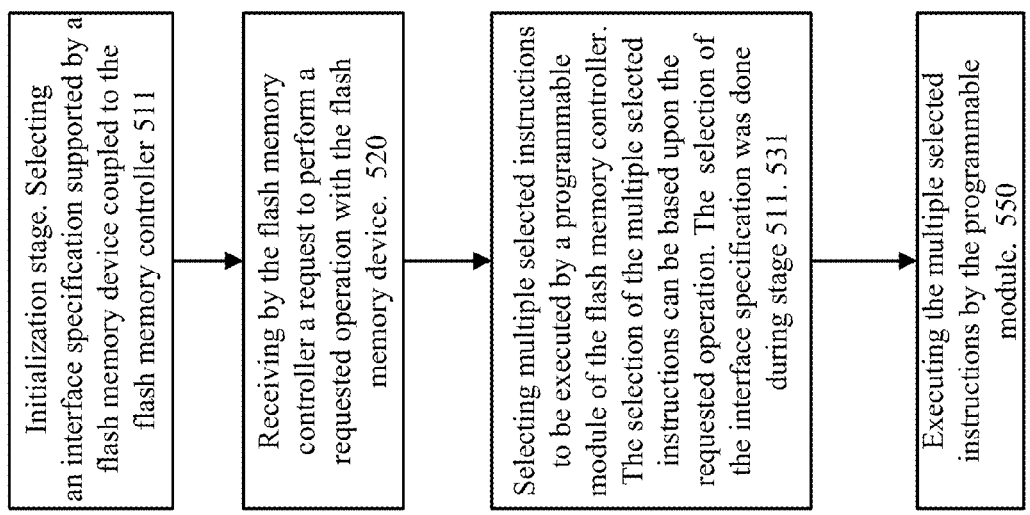

FIG. 5B illustrates method 501 for performing operations with a flash memory device, according to an embodiment of the invention.

Method 501 can be executed by a flash memory controller such as flash memory controller 400 of any one of FIGS. 4A-4C.

Method 501 can start by initialization stage 511.

The initialization stage 511 can include powering up the flash memory controller; retrieving firmware from a flash memory device and executing the firmware by an internal controller of the flash memory controller. The execution of the firmware may include determining which interface specification is supported by the flash memory device (what is the type of the flash memory device) and retrieving at least a portion of a group of instructions that corresponds to that interface specification.

It is assumed that stage 511 includes selecting the interface specification supported by the flash memory device that is coupled to the flash memory controller.

After the initialization is completed method 511 can perform multiple iterations of stages 520, 531 and 550.

Stage 520 may include receiving (by the flash memory controller) a request to perform a requested operation with the flash memory device.

Stage 520 may be followed by stage 531 of selecting multiple selected instructions to be executed by a programmable module of the flash memory controller. The selection of the multiple selected instructions can be based upon the requested operation. The selection of the interface specification was already done during stage 511.

Stage 531 may be followed by stage 550 of executing the multiple selected instructions by the programmable module.

FIG. 6 illustrates a flash memory controller 600 according to an embodiment of the invention.

Flash memory controller 600 of FIG. 6 differs from flash memory controller 400 of FIG. 4A by including a programmable signal generator 660.

The programmable signal generator 660 can be fed by instructions that indicate the waveforms that should be provided to the different lines of interface 333.

The programmable signal generator 660 can be activated instead of (or in addition to) the multiple operation phase circuits 433-436. For example, the multiple operation phase circuits can be activated during a first period of time and the programmable signal generator 660 can be activated during another period of time.

The flash memory controller 600 can determine whether to activate the programmable signal generator 660 or whether to activate the multiple operation phase circuits.

Alternatively, a selected instruction can indicate when to use the programmable signal generator 660.

The programmable signal generator 660 can be used in cases that the activation of the multiple operation phase circuits does not provide a required signal pattern. It is noted that the determination of when and whether to activate the programmable signal generator 660 can differ from this mentioned above consideration.

The programmable signal generator 660 can be fed with a bitmap that maps levels (or operations) of interface signals to points in time.

FIG. 6 illustrates a bitmap 662 that is stored at the memory module 431. The bitmap 662 can also be stored at one or more flash memory devices—(such as second flash memory device 30) as a backup.

The programmable signal generator can be fed by commands that have different format than this bit map.

FIG. 6 also illustrates an additional group of instructions 448 that is stored at the memory module 431 and at second flash memory device 30. This additional group of instructions is not associated with any if the interface specifications supported by the flash memory devices 20 and 30.

Figure 7:
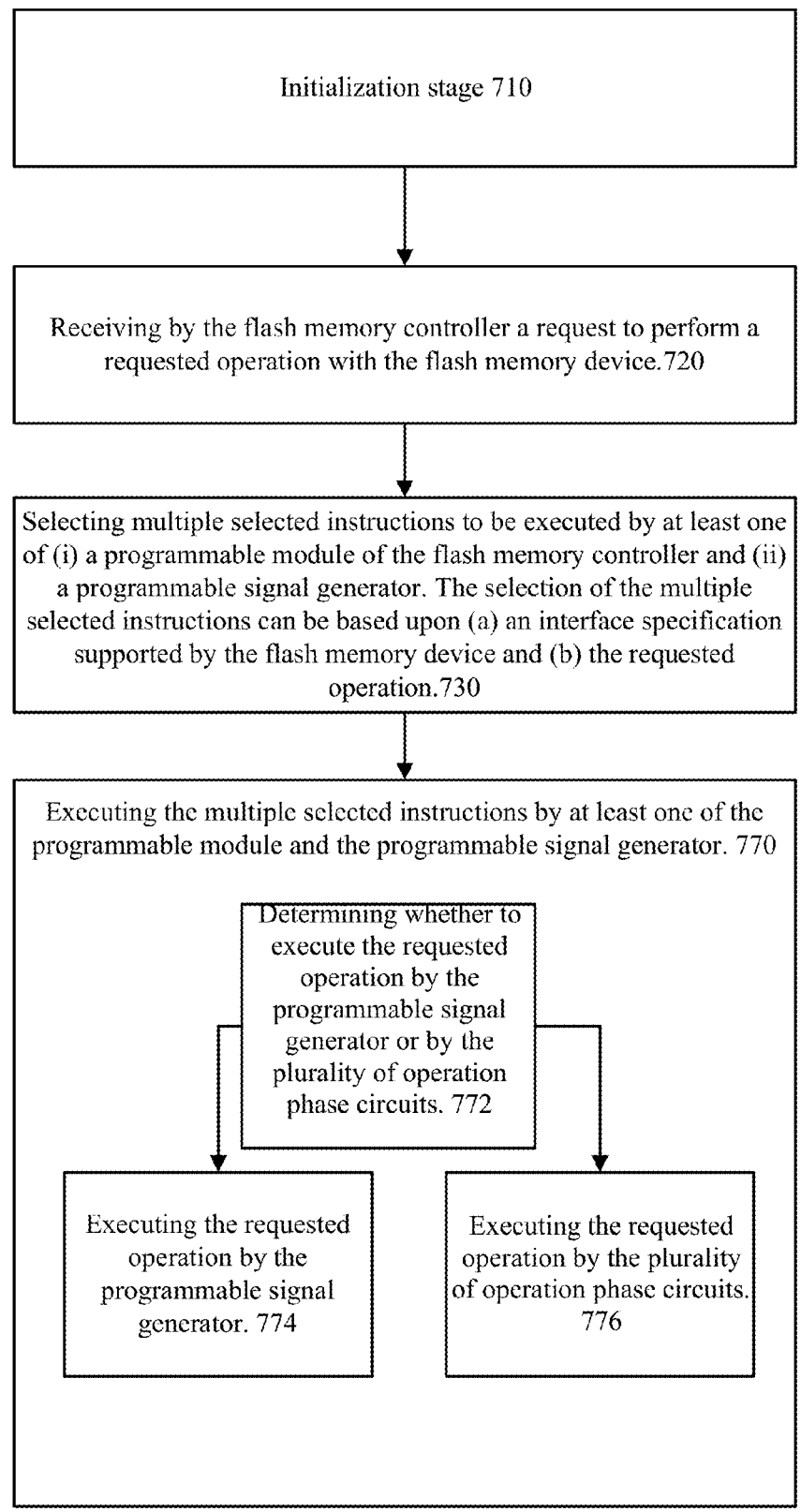
FIG. 7 illustrates a method according to an embodiment of the invention.

FIG. 7 illustrates method 700 for performing operations with a flash memory device, according to an embodiment of the invention.

Method 700 can be executed by a flash memory controller.

Method 700 can start by initialization stage 710.

The initialization stage 710 can include powering up the flash memory controller; retrieving firmware from a flash memory device and executing the firmware by an internal controller of the flash memory controller. The execution of the firmware may include determining which interface specification is supported by the flash memory device (what is the type of the flash memory device) and retrieving at least a portion of a group of instructions that corresponds to that interface specification.

After the initialization is completed method 710 can perform multiple iterations of stages 720, 730 and 770.

Stage 720 may include receiving (by the flash memory controller) a request to perform a requested operation with the flash memory device.

Stage 720 may be followed by stage 730 of selecting multiple selected instructions to be executed by at least one of (i) a programmable module of the flash memory controller and (ii) a programmable signal generator.

The selection of the multiple selected instructions can be based upon (a) an interface specification supported by the flash memory device and (b) the requested operation.

Stage 730 may be followed by stage 770 of executing the multiple selected instructions by at least one of the programmable module and the programmable signal generator.

Stage 770 can include retrieving a selected instruction that indicates that a certain signal pattern should be generate by the programmable signal generator and not by the programmable module and executing this selected instruction by the programmable signal generator.

Alternatively, stage 770 can include stages 772, 774 and 776.

Stage 772 may include determining whether to execute the requested operation by the programmable signal generator or by the plurality of operation phase circuits. It is noted that the determination can be responsive to a programmable signal generator instruction that is retrieved by the programmable module of the flash memory device.

If it is determined to execute the requested operation by the programmable signal generator then stage 772 is followed by stage 774 of executing the requested operation by the programmable signal generator.

If it is determined to execute the requested operation by the plurality of operation phase circuits then stage 772 is followed by stage 776 of executing the requested operation by the plurality of operation phase circuits.

The determining of stage 772 can be responsive to a capability of the plurality of operation phase circuits to generate a combination of waveforms mandated by the requested operation.

Figure 8:
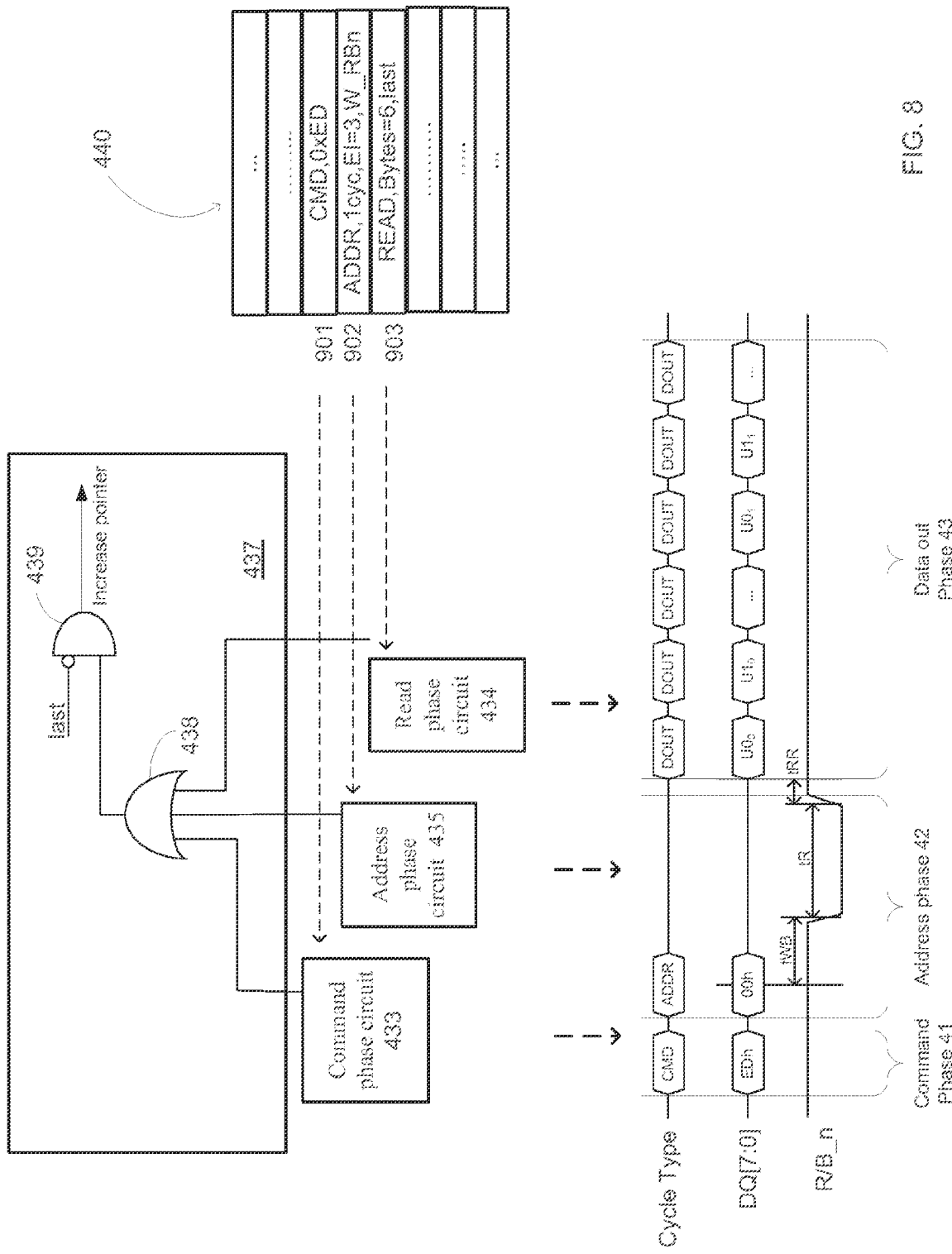
FIG. 8 illustrates an execution of three lines of a stack according to an embodiment of the invention.

FIG. 8 illustrates an execution of three lines of a stack according to an embodiment of the invention.

Stack 440 is illustrated as having three lines—each line stores one or more instructions.

A requested operation is fulfilled by executing the instructions stored in lines 901-903. The instructions in lines 901-903 are to be executed by command phase circuit 433, address phase circuit 435 and read phase circuit 434 respectively.

The execution of the instruction of line 901 causes the command phase circuit 433 to execute command phase 41. The execution of the instruction of line 902 causes the address phase circuit 435 to execute address phase 42. The execution of the instruction of line 903 causes the read phase circuit 434 to execute data out phase 43.

Each of the mentioned above operation phase circuits 433, 435 and 434 may send an end indication once it completes the execution of the relevant instruction and enables the increment of a pointer that scans stack 440. FIG. 8 illustrates an OR gate 438 that receives the end indications. The output of the OR gate 438 and an inverted input that receives a last indication (and thus stops the increment of the pointer when the last instruction is executed) are fed to a AND gate 439 that may output an increment pointer signal. OR gate 438 and the AND gate 439 are part of the memory controller 432.

Figure 9:
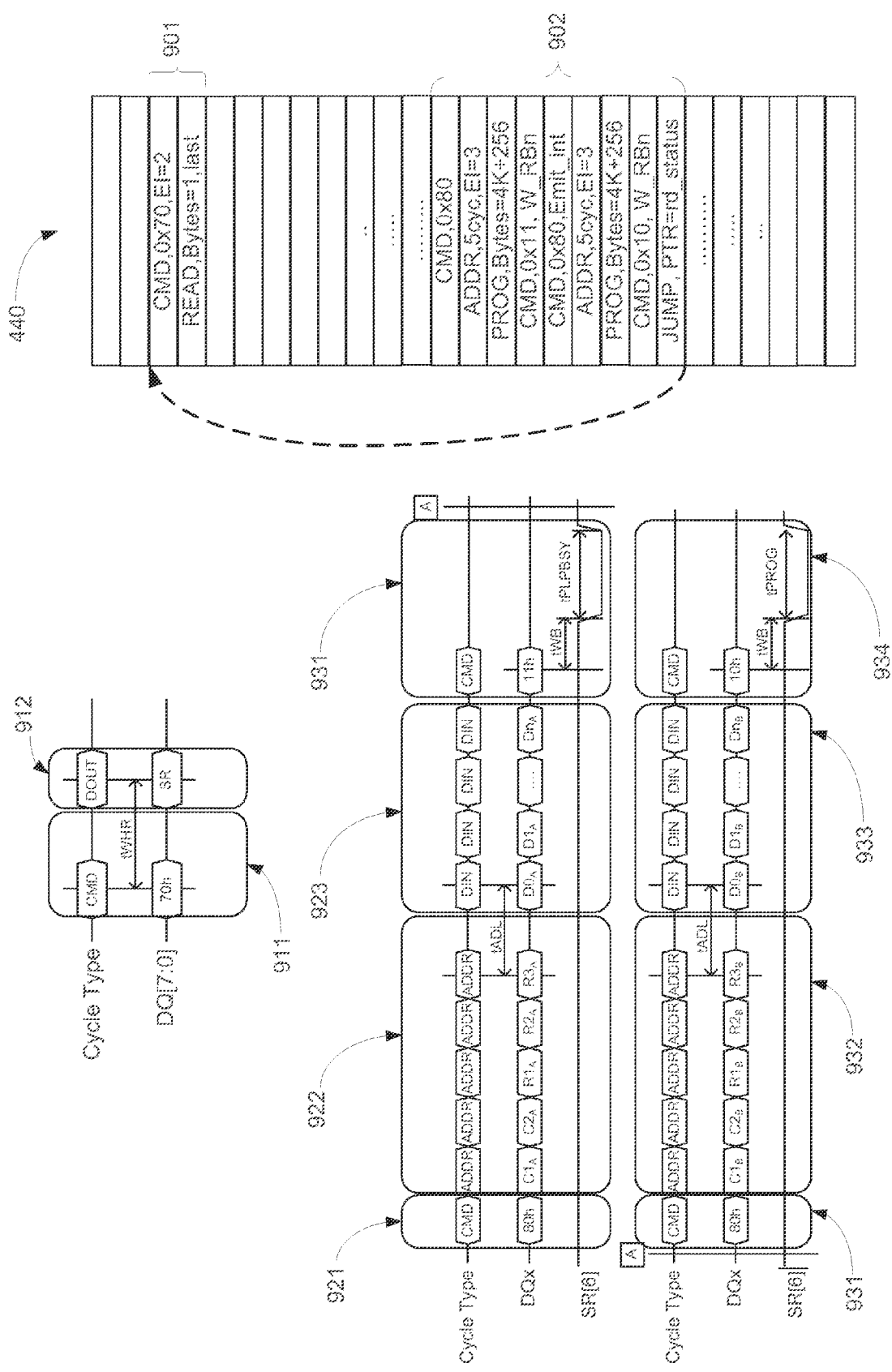
FIG. 9 illustrates an execution of two sets of instructions according to an embodiment of the invention.

FIG. 9 illustrates an execution of two sets of instructions according to an embodiment of the invention.

Stack 440 is illustrated as including a first set of instructions (stored at a pair of lines denoted 901) and a second set of instructions (Stored at lines 902). The second set of instructions is a combination of two different operations. FIG. 9 illustrates that the last line of the second set of instructions is a jump command to the first set of instructions.

The execution of the first set of instructions (check status) results in a completion of a command phase 911 that is followed by a data out phase 912.

The execution of the second sets of instructions results in a completion of a first operation that includes a command phase 921, an address phase 922, and a data out phase 923. It also results in a completion of a second operation that includes a command phase 931, an address phase 932, a data out phase 933 and a command phase 934.

Figure 10:
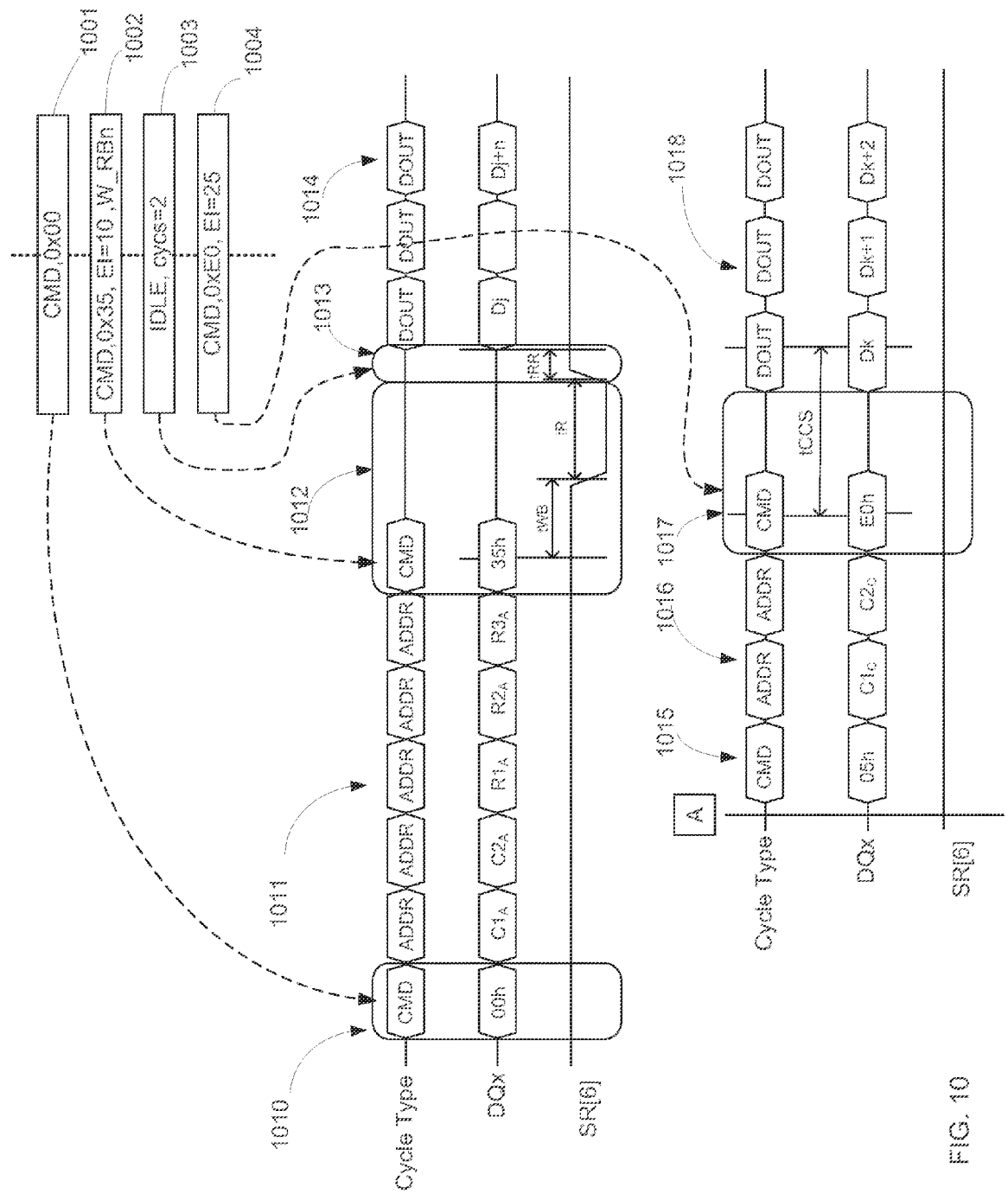
FIG. 10 illustrates an execution of sets of instructions that include idle instructions according to an embodiment of the invention.

FIG. 10 illustrates an execution of sets of instructions that include idle instructions according to an embodiment of the invention.

Lines 1001-1004 of stack 440 store various instructions. These lines are not adjacent to each other and one or more lines of stack 440 can be included between each of these lines.

Line 1001 includes a command instruction that causes the flash memory controller 400 to complete a command phase 1010. This command phase 1010 is followed by an address phase 1011, a command phase 1012, a waiting period 1013 (that can be long to the address phase or to the data out phase 1014), a data out phase 1014, a command phase 1015, an address phase 1016m a command phase 1017 and a data out phase 1018.

The relationship between each of the lines 1001-1004 and various phases are illustrates by a first dashed arrows that links line 1002 and command phase 1012, by a second dashed arrow that links line 1002 and command phase 1012, by a third dashed arrow that links line 1003 and waiting period 1013 and a fourth dashed arrow that links line 1004 and command phase 1017.

Figure 11:
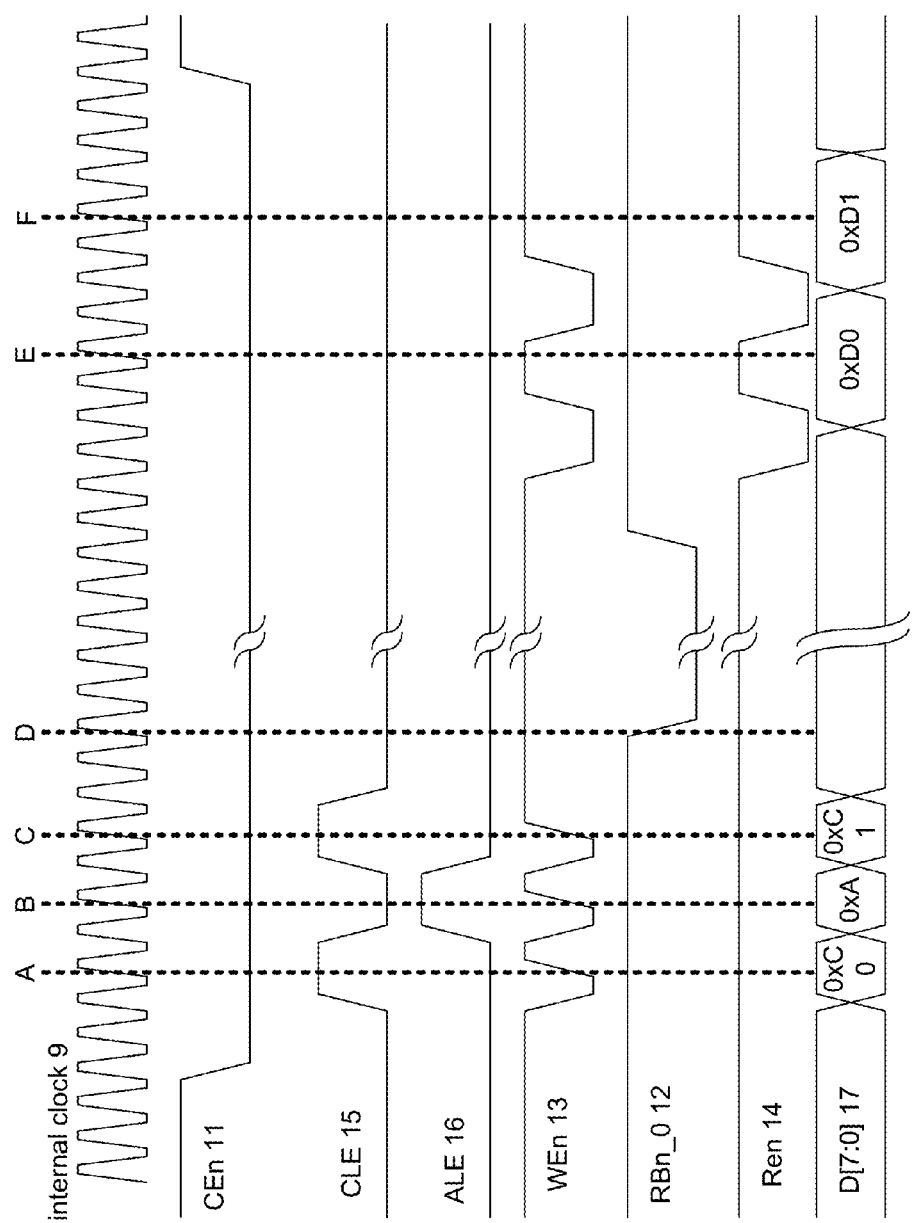
FIG. 11 illustrates a bitmap and control and data signals generated as a result from the bitmap, according to an embodiment of the invention.

FIG. 11 illustrates bitmap 662 and control and data signals 1100 generated as a result from the bitmap 662, according to an embodiment of the invention.

The programmable signal generator 660 is fed by bitmap 662 and generates the waveforms that are collectively denoted control and data signals 1100. Each row of the bitmap represents the value of a control or data signal at a certain time interval. Each column of bitmap 662 is dedicated to a single control or data signal. FIG. 11 illustrates the following signals: internal clock 9, CEn 11, CLE 15, ALE 16, WEn 13, RBN_o 12, Ren 14 and D[0:7] 17.

The invention may also be implemented in a computer program for running on a computer system, at least including code portions for performing steps of a method according to the invention when run on a programmable apparatus, such as a computer system or enabling a programmable apparatus to perform functions of a device or system according to the invention.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a non-transitory computer readable medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connections that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method, for performing operations with a flash memory device, the method comprising:
   receiving ,by a flash memory controller, a request to perform a requested operation with the flash memory device;
   selecting multiple selected instructions to be executed by a programmable module of the flash memory controller, based upon (a) an interface specification supported by the flash memory device and (b) the requested operation ; wherein the programmable module comprising multiple operation phase circuits; and
   executing the multiple selected instructions by the programmable module, wherein the executing of the multiple selected instructions comprises executing a plurality of selected instructions by multiple operation phase circuits; wherein different operation phase circuits are arranged to execute different operation phases of the requested operation;
   wherein the programmable module comprises a programmable signal generator;
   wherein the method comprises:
   determining whether to execute the requested operation by the programmable signal generator or by the multiple operation phase circuits;
   wherein if it is determined to execute the requested operation by the programmable signal generator then executing the requested operation by the programmable signal generator;
   wherein if it is determined to execute the requested operation by the multiple operation phase circuits then executing the requested operation by the plurality of operation phase circuits.

2. The method according to claim 1
   wherein the multiple operation phase circuits comprise a command phase circuit, an address phase circuit and a program phase circuit.

3. The method according to claim 1, wherein the multiple selected instructions are selected from a group of instructions that comprise a command instruction, an address instruction, a data read instruction, a data program instruction and at least one management instruction indicative of at least one of (a) a timing of an execution of another command, and (b) an order of execution of a plurality of commands.

4. The method according to claim 3, wherein the at least one management instruction is a jump instruction.

5. The method according to claim 3, wherein the group of instructions further comprises a release instruction for stopping a control of the flash memory device on the flash memory device.

6. The method according to claim 3, wherein the group of instructions further comprises an interrupt instruction for interrupting a processor that is coupled to the flash memory device and to the flash memory controller.

7. The method according to claim 1, wherein the determining is responsive to a capability of the plurality of operation phase circuits to generate a combination of waveforms mandated by the requested operation.

8. A method, for performing operations with a flash memory device, the method comprising:
   receiving, by a flash memory controller, a request to perform a requested operation with the flash memory device;
   selecting multiple selected instructions to be executed by a programmable module of the flash memory controller, based upon (a) an interface specification supported by the flash memory device and (b) the requested operation; wherein the programmable module comprising multiple operation phase circuits; and
   executing the multiple selected instructions by the programmable module, wherein the executing of the multiple selected instructions comprises executing a plurality of selected instructions by multiple operation phase circuits; wherein different operation phase circuits are arranged to execute different operation phases of the requested operation;
   wherein the flash memory device is a first flash memory device and supports a first interface specification; wherein the flash memory controller is coupled to another flash memory device that supports another interface specification, wherein the other interface specification differs from the first interface specification; wherein the method comprises:

receiving another request to perform another requested operation with the other flash memory device;

selecting multiple selected instructions to be executed by the programmable module, based upon (a) the other interface specification and (b) the other requested operation; and executing the multiple selected instructions by the programmable module.

9. A method, for performing operations with a flash memory device, the method comprising:

receiving, by a flash memory controller, a request to perform a requested operation with the flash memory device;

selecting multiple selected instructions to be executed by a programmable module of the flash memory controller, based upon (a) an interface specification supported by the flash memory device and (b) the requested operation; wherein the programmable module comprising multiple operation phase circuits; and executing the multiple selected instructions by the programmable module, wherein the executing of the multiple selected instructions comprises executing a plurality of selected instructions by multiple operation phase circuits; wherein different operation phase circuits are arranged to execute different operation phases of the requested operation;

powering up the flash memory controller; retrieving firmware from the flash memory device;

executing the firmware by an internal controller of the flash memory controller; wherein the executing of the firmware comprises determining the type of the flash memory device and retrieving at least a portion of a group of instructions, wherein the group of instructions comprises the selected instructions.

10. A non-transitory computer readable medium that stores instructions for:

receiving a request to perform a requested operation with a flash memory device;

selecting multiple selected instructions to be executed by a programmable module of the flash memory controller, based upon (a) an interface specification supported by the flash memory device and (b) the requested operation; wherein the programmable module comprising multiple operation phase circuits; and executing the multiple selected instructions by the programmable module, wherein the executing of the multiple selected instructions comprises executing a plurality of selected instructions by multiple operation phase circuits; wherein different operation phase circuits are arranged to execute different operation phases of the requested operation;

wherein the programmable module comprises a programmable signal generator;

wherein the non-transitory computer readable medium stores instructions for:

determining whether to execute the requested operation by the programmable signal generator or by the multiple operation phase circuits;

wherein if it is determined to execute the requested operation by the programmable signal generator then executing the requested operation by the programmable signal generator;

wherein if it is determined to execute the requested operation by the multiple operation phase circuits then executing the requested operation by the plurality of operation phase circuits.

11. The non-transitory computer readable medium according to claim 10 wherein the multiple operation phase circuits comprise a command phase circuit, an address phase circuit and a program phase circuit.

12. The non-transitory computer readable medium according to claim 10, wherein the selected instructions are selected from a group of instructions that comprise a command instruction, an address instruction, a data read instruction, a data program instruction and at least one management instruction indicative of at least one of (a) a timing of an execution of another command, and (b) an order of execution of a plurality of commands.

13. The non-transitory computer readable medium according to claim 12, wherein the at least one management instruction is a jump instruction.

14. The non-transitory computer readable medium according to claim 12, wherein the group of instructions further comprises a release instruction for stopping a control of the flash memory device on the flash memory device.

15. The non-transitory computer readable medium according to claim 12, wherein the group of instructions further comprises an interrupt instruction for interrupting a processor that is coupled to the flash memory device and to the flash memory controller.

16. The non-transitory computer readable medium according to claim 10 that stores instructions for determining in response to a capability of the plurality of operation phase circuits to generate a combination of waveforms mandated by the requested operation.

17. A non-transitory computer readable medium that stores instructions for:

receiving a request to perform a requested operation with a flash memory device;

selecting multiple selected instructions to be executed by a programmable module of the flash memory controller, based upon (a) an interface specification supported by the flash memory device and (b) the requested operation; wherein the programmable module comprising multiple operation phase circuits; and executing the multiple selected instructions by the programmable module, wherein the executing of the multiple selected instructions comprises executing a plurality of selected instructions by multiple operation phase circuits; wherein different operation phase circuits are arranged to execute different operation phases of the requested operation;

wherein the flash memory device is a first flash memory device and supports a first interface specification; wherein the flash memory controller is coupled to another flash memory device that supports another interface specification, wherein the other interface specification differs from the first interface specification; wherein the non-transitory computer readable medium stores instructions for:

receiving another request to perform another requested operation with the other flash memory device;

selecting multiple selected instructions to be executed by the programmable module, based upon (a) the other interface specification and (b) the other requested operation ; and executing the multiple selected instructions by the programmable module.

18. A non-transitory computer readable medium that stores instructions for:

receiving a request to perform a requested operation with a flash memory device;

selecting multiple selected instructions to be executed by a programmable module of the flash memory controller, based upon (a) an interface specification supported by the flash memory device and (b) the requested operation; wherein the programmable module comprising multiple operation phase circuits; and executing the multiple selected instructions by the programmable module, wherein the executing of the multiple selected instructions comprises executing a plurality of selected instructions by multiple operation phase circuits; wherein different operation phase circuits are arranged to execute different operation phases of the requested operation;

powering up the flash memory controller; retrieving firmware from the flash memory device;

executing the firmware by an internal controller of the flash memory controller; wherein the executing of the firmware comprises determining the type of the flash memory device and retrieving at least a portion of a group of instructions, wherein the group of instructions comprises the selected instructions.

19. A flash memory controller, comprising:
an input port arranged to receive a request to perform a requested operation with a flash memory device;
a programmable module arranged to execute multiple selected instructions, wherein the multiple selected instructions are selected by the flash memory controller based upon (a) an interface specification supported by the flash memory device and (b) the requested operation;
wherein the programmable module comprises multiple operation phase circuits that are arranged to execute a plurality of the selected instructions; wherein different operation phase circuits are arranged to execute different operation phases of the requested operation;
wherein the programmable module comprises a programmable signal generator;
wherein the flash memory controller is arranged to:
determine whether to execute the requested operation by the programmable signal generator or by the multiple operation phase circuits;
wherein if it is determined to execute the requested operation by the programmable signal generator then execute the requested operation by the programmable signal generator;
wherein if it is determined to execute the requested operation by the multiple operation phase circuits then execute the requested operation by the plurality of operation phase circuits.

20. The flash memory controller according to claim 19, arranged to determine in response to a capability of the plurality of operation phase circuits to generate a combination of waveforms mandated by the requested operation.

21. The flash memory controller according to claim 19 wherein the multiple operation phase circuits comprise a command phase circuit, an address phase circuit and a program phase circuit.

22. The flash memory controller according to claim 19, wherein the selected instructions are selected from a group of instructions that comprise a command instruction, an address instruction, a data read instruction, a data program instruction and at least one management instruction indicative of at least one of (a) a timing of an execution of another command, and (b) an order of execution of a plurality of commands.

23. The flash memory controller according to claim 22, wherein the at least one management instruction is a jump instruction.

24. The flash memory controller according to claim 22, wherein the group of instructions further comprises a release instruction for stopping a control of the flash memory device on the flash memory device.

25. The flash memory controller according to claim 22, wherein the group of instructions further comprises an interrupt instruction for interrupting a processor that is coupled to the flash memory device and to the flash memory controller.

26. A flash memory controller, comprising:
an input port arranged to receive a request to perform a requested operation with a flash memory device;
a programmable module arranged to execute multiple selected instructions, wherein the multiple selected instructions are selected by the flash memory controller based upon (a) an interface specification supported by the flash memory device and (b) the requested operation;
wherein the programmable module comprises multiple operation phase circuits that are arranged to execute a plurality of the selected instructions; wherein different operation phase circuits are arranged to execute different operation phases of the requested operation;
wherein the flash memory device is a first flash memory device and supports a first interface specification; wherein the flash memory controller is coupled to another flash memory device that supports another interface specification, wherein the other interface specification differs from the first interface specification; wherein the flash memory controller is arranged to receive another request to perform another requested operation with the other flash memory device; select multiple selected instructions to be executed by the programmable module, based upon (a) the other interface specification and (b) the other requested operation; and execute the multiple selected instructions by the programmable module.

27. A flash memory controller, comprising:
an input port arranged to receive a request to perform a requested operation with a flash memory device;
a programmable module arranged to execute multiple selected instructions, wherein the multiple selected instructions are selected by the flash memory controller based upon (a) an interface specification supported by the flash memory device and (b) the requested operation;
wherein the programmable module comprises multiple operation phase circuits that are arranged to execute a plurality of the selected instructions; wherein different operation phase circuits are arranged to execute different operation phases of the requested operation;
wherein the flash memory controller is arranged to power up the flash memory controller; retrieving firmware from the flash memory device; execute the firmware by an internal controller of the flash memory controller; wherein the execution of the firmware comprises determining the type of the flash memory device and retrieving at least a portion of a group of instructions, wherein the group of instructions comprises the selected instructions.

* * * * *